United States Patent
Zhang et al.

(10) Patent No.: US 6,985,045 B2
(45) Date of Patent: Jan. 10, 2006

(54) GAIN CONTROL CIRCUITS FOR VOLTAGE CONTROLLED OSCILLATORS

(75) Inventors: Weibiao Zhang, Plano, TX (US); Patrick P. Siniscalchi, Sachse, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/791,937

(22) Filed: Mar. 2, 2004

(65) Prior Publication Data

US 2005/0195045 A1   Sep. 8, 2005

(51) Int. Cl.
*H03L 5/00* (2006.01)
(52) U.S. Cl. .................. 331/185; 331/182; 331/176; 327/103
(58) Field of Classification Search ............. 331/185, 331/182, 176, 145, 109, 57, 17; 327/103
See application file for complete search history.

(56) References Cited

U.S. PATENT DOCUMENTS 5,515,012 A * 5/1996 Bhushan et al. ............. 331/17
5,523,723 A * 6/1996 Arcus et al. ................. 331/17
6,664,861 B2 * 12/2003 Murakami ................... 331/57
6,828,832 B2 * 12/2004 Gabillard .................... 327/103

OTHER PUBLICATIONS

Gardner, Floyd M., "Charge-Pump Phase-Lock Loops," *IEEE Transactions on Communications*, vol. COM-28, No. 11, Nov. 1980, pp. 1849-1858.

* cited by examiner

*Primary Examiner*—Joseph Chang
(74) *Attorney, Agent, or Firm*—J. Dennis Moore; W. James Brady, III; Frederick J. Telecky, Jr.

(57) ABSTRACT

A gain controlled voltage controlled oscillator. A current controlled oscillator is adapted to provide an output signal oscillating at a frequency controllable by controlling a current applied thereto. A first current source provides a first control current controllable by controlling a voltage applied thereto that has a predetermined range. A first current mirror is adapted to mirror the control current to the current controlled oscillator. A second current source is adapted to provide a second control current for mirroring to the current controlled oscillator by the first current mirror when the control voltage is in a low portion of the range.

1 Claim, 3 Drawing Sheets

GAIN CONTROL CIRCUITS FOR VOLTAGE CONTROLLED OSCILLATORS

TECHNICAL FIELD OF THE INVENTION

This invention relates to voltage controlled oscillators, and more particularly relates to gain control circuits for such oscillators.

BACKGROUND OF THE INVENTION

Voltage controlled oscillators (VCOs) are widely used in a variety of applications where a frequency controlled oscillator is needed. In some VCO applications, it is desirable to be able to control the gain of a VCO. For example, one such application is the charge-pump phase-locked-loop (PLL). FIG. 1 is a diagram of a commonly used charge-pump PLL that is described in detail in an article entitled, "Charge-Pump Phase-Lock Loops," by Floyd M. Gardner, IEEE Trans. Commun., Vol. COMM-28, November 1980.

In FIG. 1, an input signal having a frequency Fin is provided to one input of a phase frequency detector (PFD) 12. The other input of PFD 12 is provided from the output of a divide-by-M frequency divider 18. The PFD 12 has as outputs an Up signal and a Down signal that are provided to a corresponding Up input and Down input of a charge pump 14. When the Up input receives a signal, current Ip is sourced to the output of charge pump 14, while when the Down input receives a signal current Ip is sunk from the output of charge pump 14. The output of charge pump 14 is provided to a loop filter comprised of a resistor R1 and capacitor C1 connected in series between the output and ground, and a second capacitor C2 also connected between the charge pump output and ground. The common connection node of the charge pump output and the loop filter is connected to the input of a VCO 16. The output of VCO 16 has an oscillator frequency Fosc and is connected to the input of frequency divider 18. The flow of current Ip to/from the common connection node of the charge pump output and the loop filter causes a voltage Vctl at the input of VCO 16 to change accordingly, and thus control the frequency Fosc. The feedback loop through frequency divider to PFD 12 allows the PLL to output a frequency that is an M multiple of Fin and phase locked to Fin.

One important performance scale of a good PLL is stability with sufficient margin. A widely used rule of thumb is that the ratio Fin/LBW should be greater than 10, where LBW represents loop bandwidth. However, for a PLL having a fixed LBW, this ratio tends to be small when Fin is small. this can happen, for example, in applications where the PLL is used as a clock synthesizer when the input reference clock has a low frequency. In such instances, when Fin is sufficiently low, the fixed LBW results in compromised stability of the PLL. thus, a problem exists in the stability of the PLL when Fosc is small.

SUMMARY OF THE INVENTION

The present invention provides a gain controlled voltage controlled oscillator. In it, a current controlled oscillator is adapted to provide an output signal oscillating at a frequency controllable by controlling a current applied thereto. A first current source provides a first control current controllable by controlling a voltage applied thereto that has a predetermined range. A first current mirror is adapted to mirror the control current to the current controlled oscillator. A second current source is adapted to provide a second control current for mirroring to the current controlled oscillator by the first current mirror when the control voltage is in a low portion of the range.

In one embodiment, the first current source is a first MOS transistor having the control voltage applied to a gate thereof and connected by its source and drain between an input of the first current mirror and ground, and the second current source includes a current source element providing a supplemental current, a second current mirror comprising a second transistor and a third MOS transistor, wherein the second MOS transistor is connected to the current source element and the third MOS transistor is adapted to mirror the supplemental current, the third MOS transistor being connected to the common connection node of the first current source and the first current mirror; and a fourth MOS transistor having a gate connected to the gate of the first MOS transistor and being connected by its source and drain between the current source element and ground. This embodiment provides a superior power supply rejection ratio.

These and other features of the invention will be apparent to those skilled in the art from the following detailed description of the invention, taken together with the accompanying drawings.

DETAILED DESCRIPTION OF THE PREFERRED EMBODIMENT

The numerous innovative teachings of the present invention will be described with particular reference to the presently preferred exemplary embodiments. However, it should be understood that this class of embodiments provides only a few examples of the many advantageous uses and innovative teachings herein. In general, statements made in the specification of the present application do not necessarily delimit the invention, as set forth in different aspects in the various claims appended hereto. Moreover, some statements may apply to some inventive aspects, but not to others.

Figure 2:
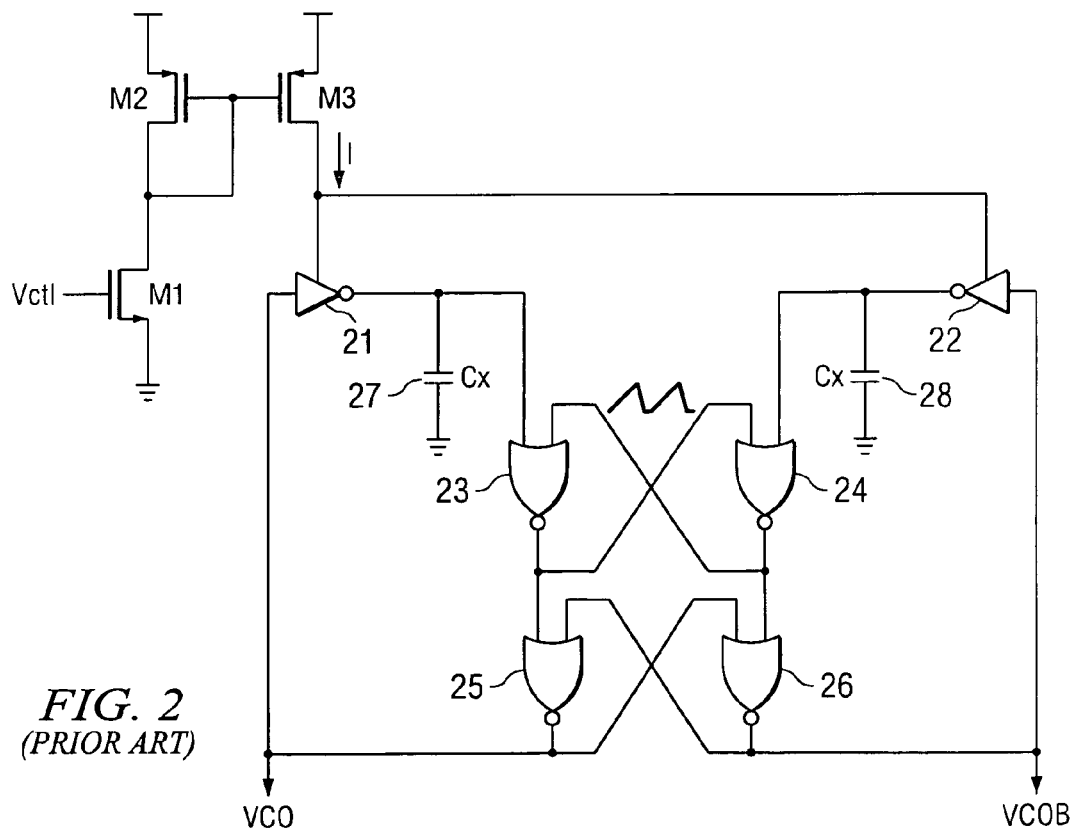
FIG. 2 is a diagram of a prior art differential relaxation VCO.

FIG. 2 it is a diagram of an exemplary relaxation VCO. The voltage Vctl is provided to the gate of an NMOS transistor M1 having its source connected to ground. PMOS transistors M2 and M3 are connected together in a current mirror configuration. Thus, both M2 and M3 have their sources connected to the power supply, VDD, while their gates connected together and to the drain of transistor M2. The drain of transistor M1 is connected to the drain of transistor M2. In this way, the current through transistor M1 is mirrored to the drain of transistor M3, the control voltage Vctl controlling the current through transistor M1.

Figure 7:
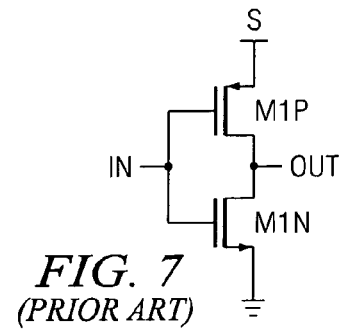
FIG. 7 is a diagram of a prior art inverter.

The drain of the transistor M3 is connected to a relaxation oscillator structure, made of inverters 21 and 22, NOR gates 23, 24, 25 and 26, and capacitors 27 and 28, each having a value Cx. Inverters 21 and 22 may be of conventional construction, for example, as shown in FIG. 7. In FIG. 7 it can be seen that a PMOS transistor MIP and an NMOS transistor MIN are connected in series between ground and a power source S. Their gates are connected together, and form the input port IN. The drain of transistor MIP is connected to the drain of transistor MIN, and that their common connection node forms the output port OUT. Returning to FIG. 2, it will be appreciated that the power source connection S of inverters 21 and 22 is connected to the drain of transistor M3. In this way, when either inverter is receiving a low input, the current I mirrored through transistor M3 flows directly through the PMOS transistor of the inverter to the output of the invertor to thus charge up the associated capacitor 27 or 28, as the case may be.

The outputs of inverters 21 and 22 are connected to a cross coupled arrangement of NOR gates 23, 24, 25 and 26, as shown. The outputs of the cross coupled arrangement of NOR gates are connected to the inputs of inverters 21 and 22, respectively, as shown. The outputs of the differential relaxation VCO, VCO and VCOB, are taken from the outputs of the cross coupled arrangement of NOR gates.

Figure 3:
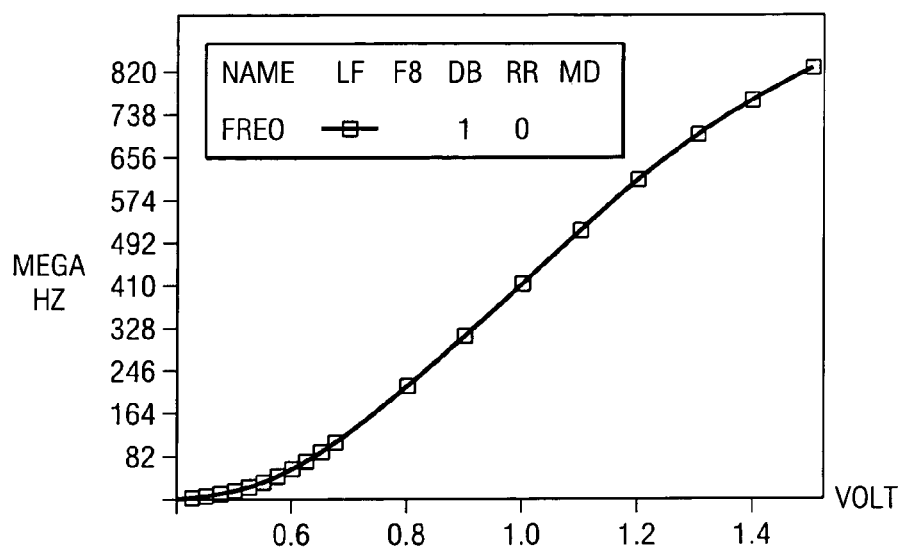
FIG. 3 is a graph of frequency versus Vctl for the VCO of FIG. 2.

A graph of the frequency of the outputs of the differential relaxation VCO of FIG. 2 versus the control voltage Vctl is shown in FIG. 3. The gain of the VCO is defined as the ratio of the VCO frequency to the control voltage, i.e. the slope of the curve shown in FIG. 3. Comparatively, it can be seen in FIG. 3 that the gain at lower frequencies is smaller than the gain at higher frequencies. But, for some applications where Fin is low, it is desirable to have the gain at low frequency even smaller.

Figure 1:
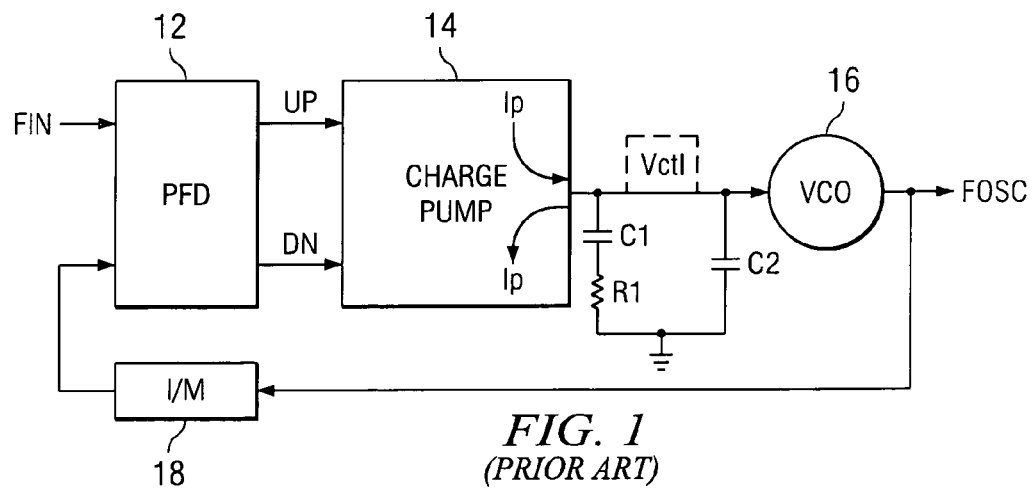
FIG. 1 is a diagram of a prior art charge pump PLL.

Typically, the value of C2 in FIG. 1 is much smaller than the value of C1, and the PLL can be approximated as a second order system. In this way, the closed loop transfer function may be expressed as:

$$T(s) = \frac{G(s)}{1 + G(s)H(s)} = \frac{Kv * Ip(sR1 * C1 + 1)/C1}{s^2 + s(Kv * Ip * R1/M) + (Kv * Ip/(M * C1))},\quad \text{Eq. (1)}$$

where Kv is the VCO gain in Hz/V, Ip is the charge pump current in amps, R1 is the value of resistor R1 in ohms, C1 is the value of capacitor C1 in farads, and M is the decimal value of the divide-by-M frequency divider 18. The denominator in the Equation (1) is the characteristic equation for the loop, and defines some of the key parameters: damping factor, df, and natural frequency, ωn. This can be seen as follows:

$$s^2 + s(2 * df * \omega n) + \omega n^2 = 0 \quad \text{Eq. (2)}$$

$$df = \frac{R1 * C1}{2}\sqrt{\frac{Kv * Ip}{M * C1}} \quad \text{Eq. (3)}$$

$$\omega n = \sqrt{\frac{Kv * Ip}{M * C1}} \quad \text{Eq. (4)}$$

The loop bandwidth LBW may be represented as:

$$LBW = \frac{\omega n}{2\pi}\sqrt{2 * df^2 + 1 + \sqrt{(2 * df^2 + 1)^2 + 1}} \quad \text{Eq. (5)}$$

As discussed above, in order to have enough stability margin, it is necessary to have a smaller LBW when Fin is smaller. From Equation (5), it can be seen that LBW can be lowered by reducing df or ωn. However, if df is reduced the settling of the PLL is degraded. For example, when the df is smaller than 0.5, the second order system step response would have overshoot and the settling time would be significantly impacted. Thus, reducing df may not be desirable. In fact, in general, in PLL it is desirable to have a df greater than 0.5. For a given value of R1, Ip, and M, ωn can be lowered by either reducing VCO gain or by increasing the value of C1 In practice, capacitor C1 is it relatively large capacitor and takes a lot of silicon area. Even if the area is not an issue, increasing the value of capacitor C1 leads to a decreasing ωn and increasing the df (from Equations (3) and (4)) at the same time, which in combination increases the LBW (from Equation (5)).

The present invention decreases Kv for low frequencies, while maintaining Kv unchanged at other frequencies.

As mentioned above, VCO gain is the slope of the frequency versus voltage curve. For the circuit shown in FIG. 2, this curve is determined by the Vctl to I circuits and the value Cx of capacitors 27 and 28. Increasing the size of Cx or decreasing the W/L ratio of M1 can reduce VCO gain, but the VCO frequency range is also reduced, which may be undesirable in certain applications.

Figure 4:
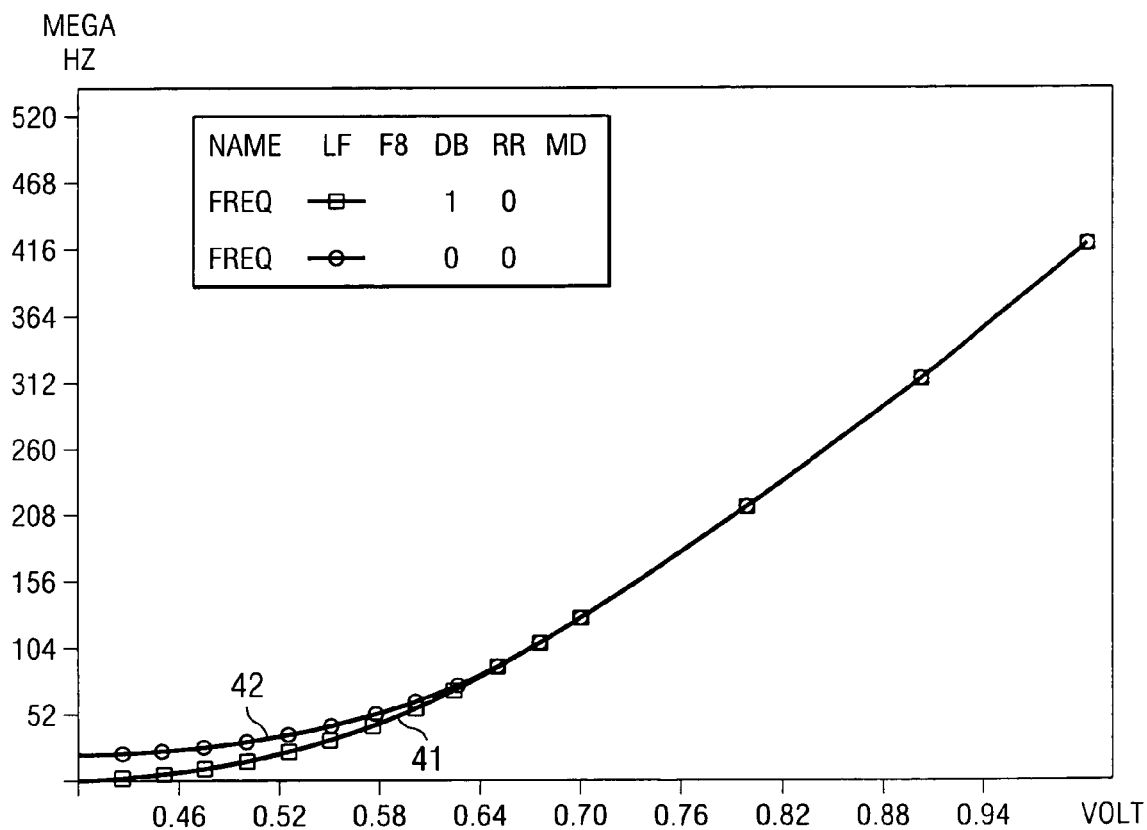
FIG. 4 is a graph like that shown in FIG. 3, and also showing an objective of the present invention.

According to embodiments of the present invention, a small current I' is added into current I when Vctl is small, but removed when Vctl is large. This modifies the frequency versus voltage curve at low frequencies by making the slope smaller in that range. This is illustrated in FIG. 4, wherein the uncompensated curve 41 can be seen to have a greater slope than compensated curve 42 at lower frequencies.

Figure 5:
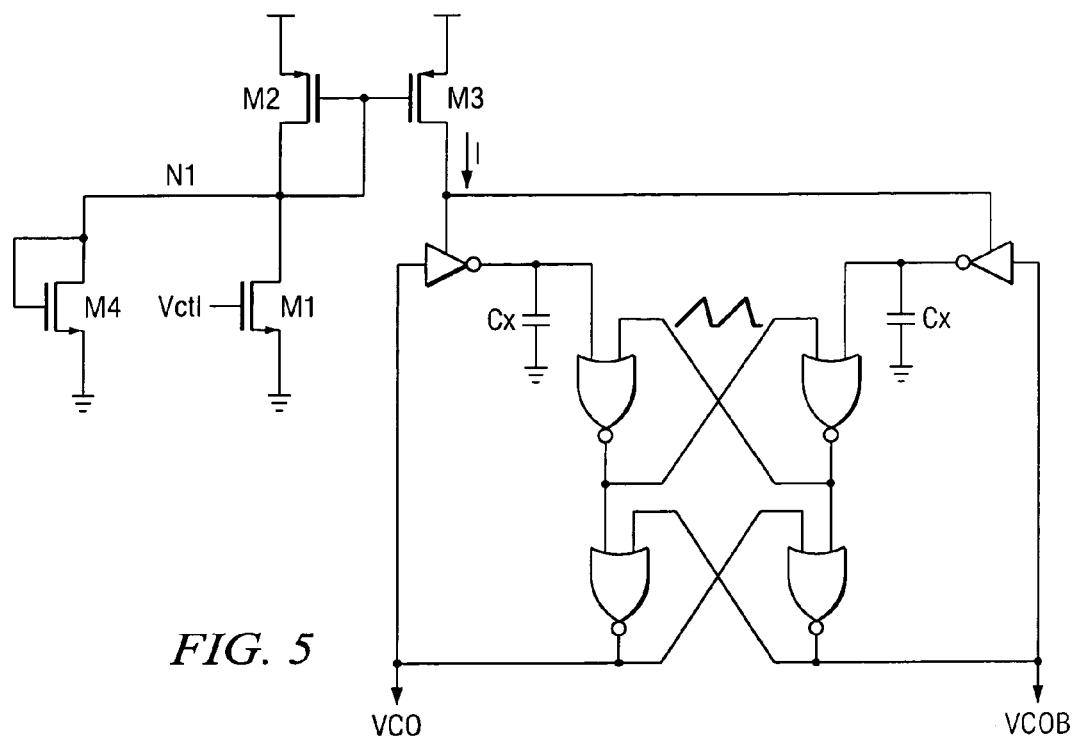
FIG. 5 is a diagram of a first embodiment of the present invention.

A first embodiment of the present invention is shown in FIG. 5. The circuit shown in FIG. 5 is the same as the circuit shown in FIG. 2, but has added to it NMOS transistor M4 which is diode-connected between the common connection node, N1, of transistors M1 and M2 and ground. When voltage Vctl is low, The voltage at node N1 is high and there is a current I' through transistor M4, which along with current I, is mirrored to the relaxation VCO through the current mirror of transistors M2 and M3. In this way the VCO frequency versus voltage curve for low values of Vctl maintains a smaller slope at low frequencies. However, a limitation of the embodiment shown in FIG. 5 is that the power supply rejection ratio (PSRR) may be insufficient for some applications. This is due to the fact that the impedance of transistor M4 is 1/gm, which is low, potentially causing large variations of current I with fluctuations in the power supply. Accordingly, the embodiment shown in FIG. 5 is not considered preferred.

Figure 6:
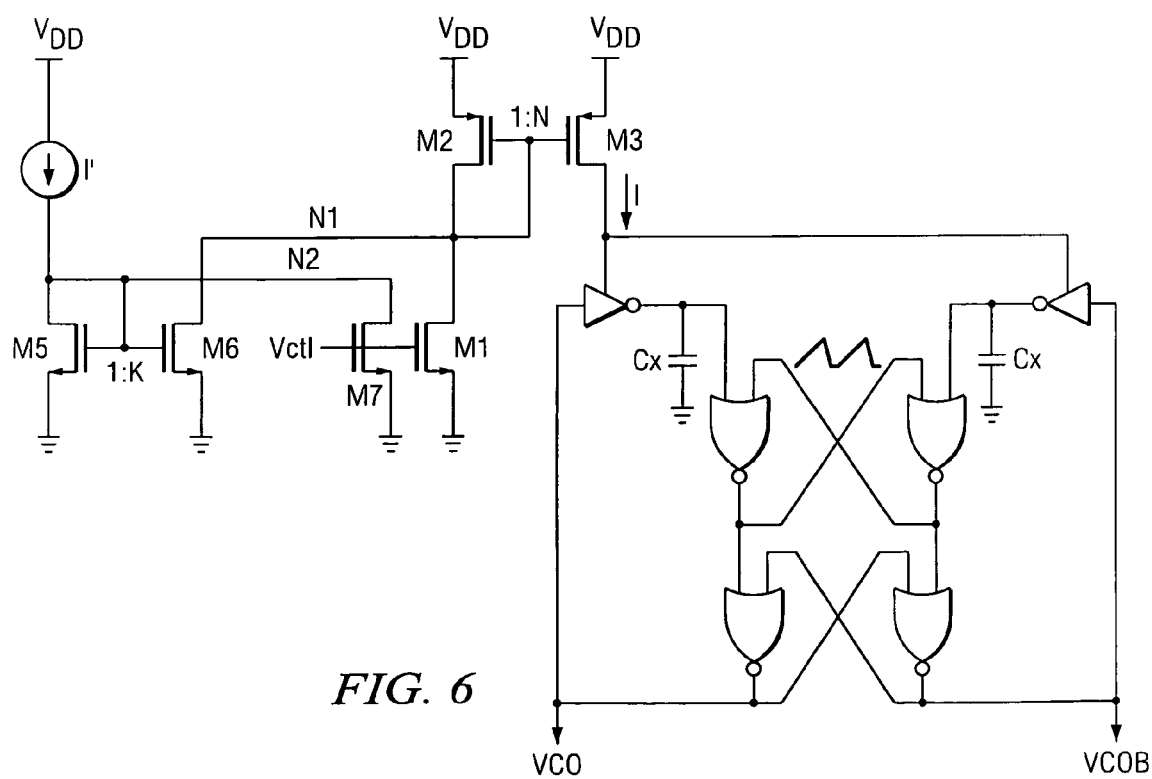
FIG. 6 is a diagram of a second, preferred embodiment of the present invention.

A second, preferred, embodiment of the present invention is shown in FIG. 6. The circuit shown in FIG. 6 is the same as the circuit shown in FIG. 2, but has added to it NMOS transistors M5, M6 and M7, and current source I', connected as shown. Thus, the gates of transistors M1 and M7 are connected together. Transistors M5, M6 and M7 each have their sources connected to ground. The drain of transistor M5 is connected to current source I', to the gates of transistors M5 and M6, and to the drain of transistor M7, the common connection node being node N2. The drain of transistor M6 is connected to the common connection node of transistors M1 and M2, being node N1.

In operation, when voltage Vctl is low, transistor M7 is off and the current I' of current source I' is mirrored through transistors M5, M6, M2 and M3 to the differential relaxation VCO. As voltage Vctl increases, transistor M7 is gradually turned on, causing the voltage at node N2 to fall. As this occurs, current I' is shunted to ground through transistor M7. Current I' is not added to current I when Vctl is sufficiently high, ensuring that the VCO has a wide frequency range. At the same time, transistor M6 is not in triode region, so that the PSRR of the VCO in FIG. 6 is superior to that of the circuit shown in FIG. 5.

Although the present invention and its advantages have been described in detail, it should be understood that various changes, substitutions and alterations can be made herein without departing from the spirit and scope of the invention as defined by the appended claims.

What is claimed is:

1. A gain controlled voltage controlled oscillator, comprising:
    a current controlled oscillator adapted to provide an output signal oscillating at a frequency controllable by controlling a current applied thereto;
    a first current source providing a first control current controllable by controlling a voltage applied thereto that has a predetermined range;
    a first current mirror adapted to mirror the control current to the current controlled oscillator and comprising a first MOS transistor having the control voltage applied to a gate thereof and connected by its source and drain between an input of the first current mirror and ground; and
    a second current source adapted to provide a second control current for mirroring to the current controlled oscillator by the first current mirror when the control voltage is in a low portion of the range, comprising
        a current source element providing a supplemental current,
        a second current mirror comprising a second transistor and a third MOS transistor, wherein the second MOS transistor is connected to the current source element and the third MOS transistor is adapted to mirror the supplemental current, the third MOS transistor being connected to the common connection node of the first current source and the first current mirror, and
        a fourth MOS transistor having a gate connected to the gate of the first MOS transistor and being connected by its source and drain between the current source element and ground.

* * * * *